United States Patent [19]

Bloomer

[11] Patent Number: 4,547,828
[45] Date of Patent: Oct. 15, 1985

[54] CIRCUIT FOR PREVENTING EXCESSIVE POWER DISSIPATION IN POWER SWITCHING SEMICONDUCTORS

[75] Inventor: Milton D. Bloomer, Scotia, N.Y.

[73] Assignee: General Electric Company, Schenectady, N.Y.

[21] Appl. No.: 499,590

[22] Filed: May 31, 1983

[51] Int. Cl.[4] .............................................. H02H 3/20
[52] U.S. Cl. ...................................... 361/86; 323/289
[58] Field of Search .................... 361/86, 100, 88, 87, 361/93; 323/279, 289, 237, 241, 323

[56] References Cited

U.S. PATENT DOCUMENTS

| 4,115,828 | 9/1978 | Rowe et al. | 361/86 |
| 4,146,903 | 3/1979 | Dobkin | 323/289 |
| 4,363,068 | 12/1982 | Burns | 361/100 |
| 4,421,993 | 12/1983 | Bloomer | 307/126 |
| 4,429,339 | 1/1984 | Jaeschke et al. | 361/93 |
| 4,447,764 | 8/1984 | Kornrumpf et al. | 315/240 |

FOREIGN PATENT DOCUMENTS

| 1396314 | 6/1975 | United Kingdom . |
| 1598996 | 3/1978 | United Kingdom . |
| 1601999 | 5/1978 | United Kingdom . |
| 2056808 | 3/1981 | United Kingdom . |
| 2082003 | 8/1981 | United Kingdom . |
| 2078040 | 12/1981 | United Kingdom . |

Primary Examiner—A. D. Pellinen
Assistant Examiner—Hong K. Choe
Attorney, Agent, or Firm—Geoffrey H. Krauss; James C. Davis, Jr.; Marvin Snyder

[57] ABSTRACT

A circuit for preventing excessive power dissipation and for avoiding latch-up, in power switching semiconductor devices, monitors the forward conduction drop of the switching semiconductor device and removes the control electrode drive signal provided thereto, if the drive signal is insufficient for supporting the load current flowing through the driven device. The voltage across the controlled-conduction portion of the switching device is monitored and compared to a reference voltage, which may be also related to the load current, to remove switching device drive if the controlled-conduction portion voltage exceeds the reference comparison voltage.

13 Claims, 5 Drawing Figures

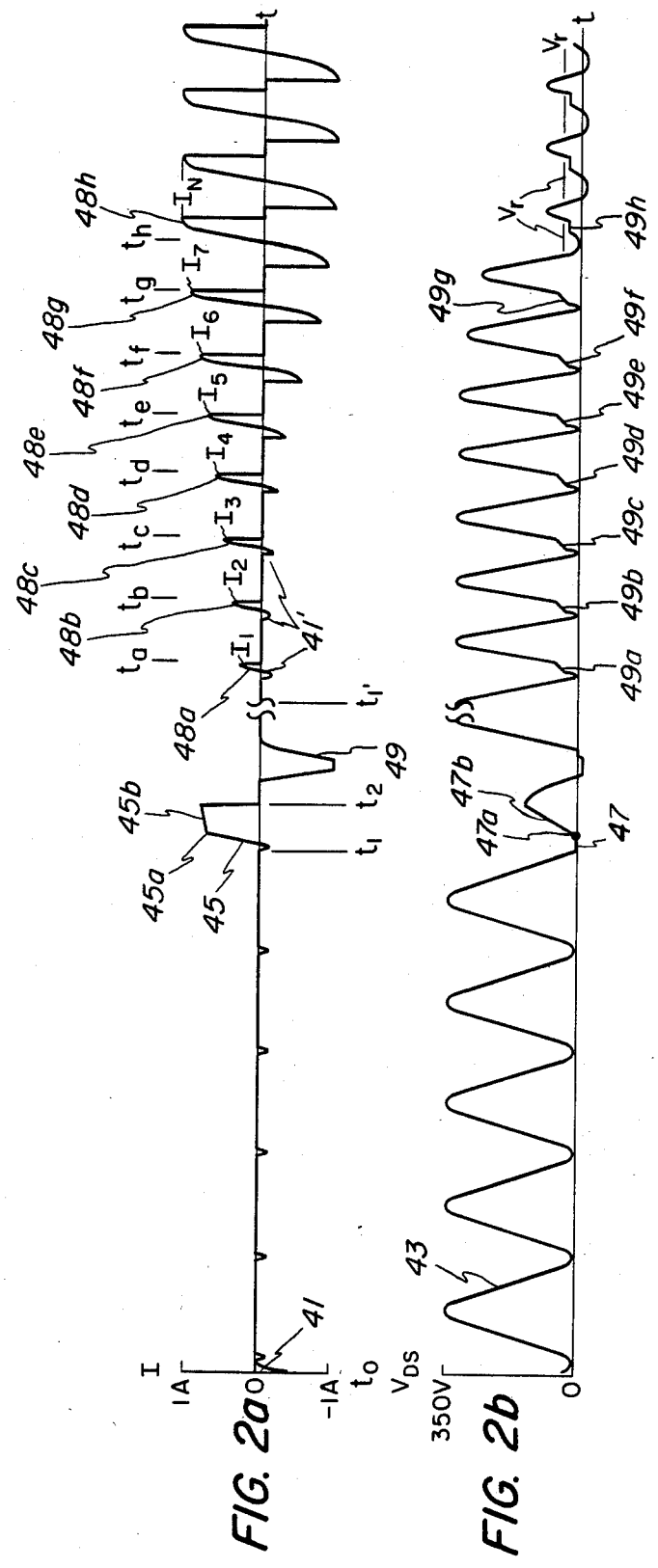

CIRCUIT FOR PREVENTING EXCESSIVE POWER DISSIPATION IN POWER SWITCHING SEMICONDUCTORS

BACKGROUND OF THE INVENTION

The present application relates to safe operation of semiconductor power switching devices and, more particularly, to a novel circuit for preventing excess power dissipation and/or latch-up in power switching semiconductor devices by removal of the drive signal to the control electrode thereof if the drive signal is insufficient to support the device load current.

It is known that a solid-state switching device, particularly when used to control one or more loads operating from the power line and from "starved" power supplies, may not have a control electrode drive signal of adequate magnitude furnished thereto for supporting the larger load current required during a "cold start" of the associated load. For example, in the case of a tungsten load, such as a light bulb and the like, the temperature coefficient of the load results in the start-up load current being considerably greater than the load current drawn by the load once the load has reached steady-state operating conditions. A switching semiconductor device in series with that load may be provided with adequate drive to support the steady-state load current, but not for the larger "cold-start" current, in which case the device operating point moves into the active region and excessive power dissipation occurs. Further, in other instances where a power switching semiconductor device is to be normally operated as either a fully cut-off device or a fully saturated device, transient conditions during normal operation may cause the switching semiconductor device to pull out of the saturation condition into the "active" condition. Operation in the high-dissipation active region often causes the switching device maximum temperature to be exceeded, and the device to be destroyed. The problem is further exacerbated in the case of metal-oxide-semiconductor (MOS) gated devices, particularly devices such as the insulated-gate rectifier, which can enter into a destructive latch-up mode of operation if operated in the active region. It is therefore highly desirable to provide a circuit for controlling a power switching semiconductor device into its cut-off condition if the drive signal at the device control electrode, e.g. the gate electrode in an FET or IGR device, or the base electrode in a power transistor, is not sufficient to maintain the semiconductor device in the saturated condition for an increase in the load current controlled thereby.

BRIEF SUMMARY OF THE INVENTION

In accordance with the invention, a protection circuit monitors at least the voltage drop across the controlled-conduction circuit of a power switching semiconductor device whenever a drive signal is provided to the control electrode of that device. The protection circuit removes the drive signal from the control electrode in the event that the conduction-circuit voltage drop exceeds one of a predetermined fixed level or a level proportional to load current. The protection circuit therefore switches the protected semiconductor device(s) into a cut-off condition to prevent damage to that device during intervals of inadequate control electrode drive signal; the protection circuit can also prevent the controlled device(s) from conducting more than a given maximum current by setting the magnitude of the control electrode drive signal to a value which will not permit the semiconductor device to support more than the desired maximum current without pulling out of saturation and subsequently being driven to the cut-off condition.

Accordingly, it is an object of the present invention to provide a novel protection circuit for removing the drive signal from the control electrode of at least one power switching semiconductor device if the drive signal magnitude is insufficient for allowing the at least one device to support the load current flowing therethrough.

This and other objects of the present invention will become apparent upon consideration of the following detailed description, when read in conjunction with the drawings.

BRIEF DESCRIPTION OF THE DRAWINGS

FIGS. 2a and 2b are coordinated graphic representations of the drain current and drain-source voltage in an FET load-current controlling circuit, with and without the protective circuit of the present invention.

DETAILED DESCRIPTION OF THE INVENTION

Figure 1A:
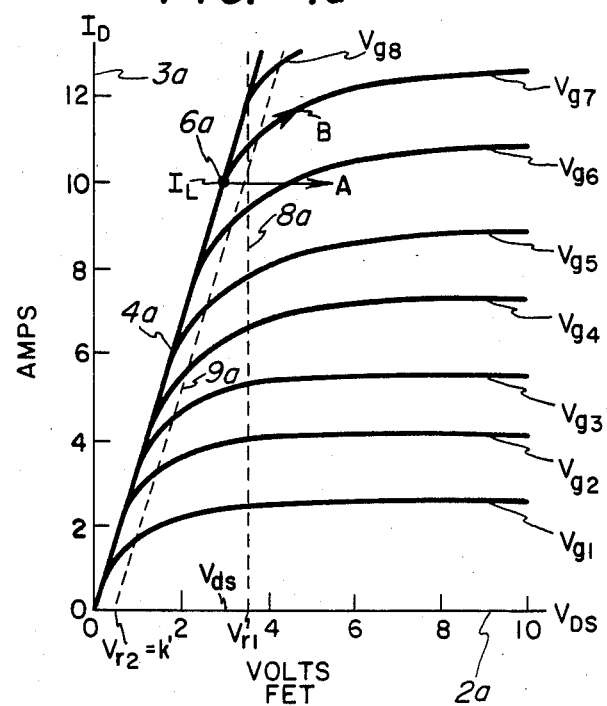
FIGS. 1a and 1b are graphic representations of the forward transfer characteristics of a power field-effect transistor (FET) and an insulated-gate rectifier (IGR), respectively, and particularly illustrating the saturation region and the characteristic operating curves of the protection circuit in accordance with the principles of the present invention.
Figure 1B:
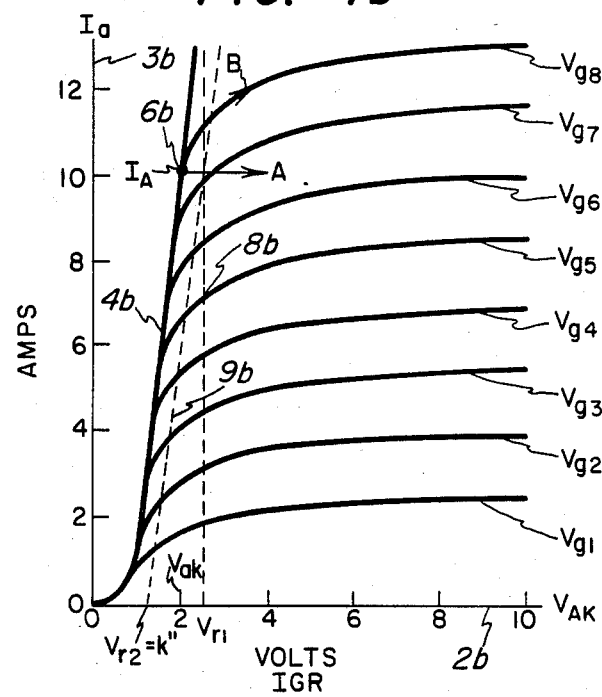

Referring initially to FIGS. 1a and 1b, the approximate forward transfer characteristics of an FET (FIG. 1a) and an IGR (FIG. 1b) are shown, with the drain-source voltage $V_{DS}$ or the anode-cathode voltage $V_{AK}$, respectively, being plotted along abscissa 2a or 2b, and with the drain current $I_D$ or the anode current $I_A$, respectively, being plotted along ordinate 3a or 3b. As is well known, each of a family of curves is provided for each of a plurality of different control electrode voltages $V_{g1}$ through $V_{g8}$, with respect to a common electrode of the device. For lesser values of the voltage across the controlled-conduction channel of the device, e.g. lesser values of $V_{DS}$ or $V_{AK}$, there is a maximum value of controlled-conduction channel current possible; this maximum value lies along the device saturation curve 4a or 4b. A power switching semiconductor device is typically operated between a saturated condition and a cut-off condition, wherein substantially zero channel current flows (although the voltage across the device is generally the maximum circuit voltage, and may be as high as 180 volts in a 120 V.A.C. line-operated circuit). In the saturation condition, the device has an "on" operating point along the saturation curve 4. Illustratively, the devices characterized by the curves of FIGS. 1a and 1b are operated with a saturated load current $I_L$ of 10 amperes, at saturated operating points 6a and 6b, respectively. The resulting forward drop $V_{ds}$ of the FET switching device (FIG. 1a) is about 3 volts, for a device having a 0.3 ohm saturation resistance, while the voltage drop $V_{ak}$ of the IGR is about 2 volts (with an equivalent saturation resistance of 0.12 ohms, plus a diode drop of about 0.8V in series therewith). As is also well known, it is not desirable that the switching device be operated in the active region (any point on the characteristic transfer curve other than the fully cut-off point (not shown) or the saturation point 6) to minimize power dissipation. It is also desirable that switching between the saturation and cut-off points occur in a minimum of time, consistent with the acceptable dv/dt and di/dt constraints for the device and/or circuit in which the device is used.

It will be seen that there is a minimum control electrode voltage $V_g$ required to maintain each of the devices essentially in saturation at the illustrated operating point 6. In particular, at least 7 volts (as indicated by the $V_{g7}$ curve of FIG. 1a) above a threshold voltage are required on the gate electrode, with respect to the source electrode, of the FET device, while at least 8 volts above threshold are required at the IGR gate with respect to the cathode thereof, for maintaining the respective devices in saturation at the illustrated 10 ampere level. Any control electrode (gate) voltage less than this level will cause the operating point to move generally to the right, in the direction of arrow A. Similarly, if the load impedance is reduced and even greater current is required to flow through the controlled-conduction channel of the switching device, the operating point moves along the gate voltage curve, in the direction of arrow B, and causes a higher forward conduction voltage drop to be present. In either case, the increased forward conduction voltage drop, with or without an increased channel current, places the device in the active region and results in increased power dissipation.

In accordance with my invention, the conduction channel voltage drop, e.g. the voltage $V_{ds}$ in an FET, the forward voltage drop $V_{ak}$ in an IGR and the like, is compared against a reference voltage to determine if the switching device has "pulled out" of saturation and is operating in the active region. The reference voltage may be a constant voltage, as indicated by broken line 8a or 8b, having a magnitude $V_{r1}$ slightly greater than the expected channel voltage drop of the device operating at its intended saturation operating point. Thus, the FET device drain-source voltage drop might be compared to a constant-voltage curve 8a, of magnitude $V_{r1}=3.5$ volts, for a device normally having a voltage drop $V_{ds}$ of 3.0 volts at the intended saturation current $I_L$ of 10 amps., while the IGR desired channel voltage $V_{ak}$ of 2.0 volts may be compared against a constant-voltage curve 8b having a reference voltage $V_{r1}$ value of about 2.5 volts. It will be seen that decreased control electrode drive signal magnitude or increased channel current flow will move the operating point along one of curves A or B and rapidly reach curve 8a or 8b, causing the drive to be removed from the switching device, to place the switching device in the cut-off condition. Even more advantageously, a reference voltage curve 9a or 9b may be utilized with the curve 9 being proportional to the channel current. The slope of curve 9 is established to be substantially parallel to the slope of the device saturation curve 4. Thus, a "proportional" reference curve 9 has a characteristic equation of the form: $V_9 = V_{r2} + I_C \times R_c$, where $V_{r2}$ is a substantially constant offset voltage, $I_C$ is the device channel current and $R_c$ is the device dynamic channel resistance. For the FET of FIG. 1a, the offset voltage $V_{r2}$ is a first constant (k', advantageously of about 0.5 volts) and the dynamic channel resistance $R_c$ is about 0.3 ohms. Similarly, for the IGR of FIG. 1b, a somewhat greater offset voltage $V_{r2}$ (equal to another constant, k'', of about 0.9 volts) is used, with a dynamic channel resistance $R_c$ of about 0.12 ohms, to model the equation of voltage reference curve 9b. As in the constant-magnitude reference curve 8 case, if the control electrode (gate) voltage is less than the required level or if excessive controlled-conduction circuit current begins to flow, the operating point 6 of the device moves in the direction of one of arrows A or B, respectively, and the device forward voltage drop rapidly increases to a value equal to, or greater than, the curve 9 reference voltage, whereupon control electrode drive is removed and the device is switched to the cut-off condition, preventing excessive power dissipation and/or device latch-up.

It should be understood that, in the case of a device, such as an FET and the like, in which the controlled-conduction channel resistance has a temperature dependency, the substantially-constant reference voltage (of curve 8) or the channel-current-dependent reference voltage (of curve 9) could be provided with a like temperature coefficient to establish a maximum current limit or provide a higher fixed reference to establish a maximum device temperature limit, at a given current. Thus, the illustrative curves of FIGS. 1a and 1b are illustrative of operation at a single temperature.

Figure 2:
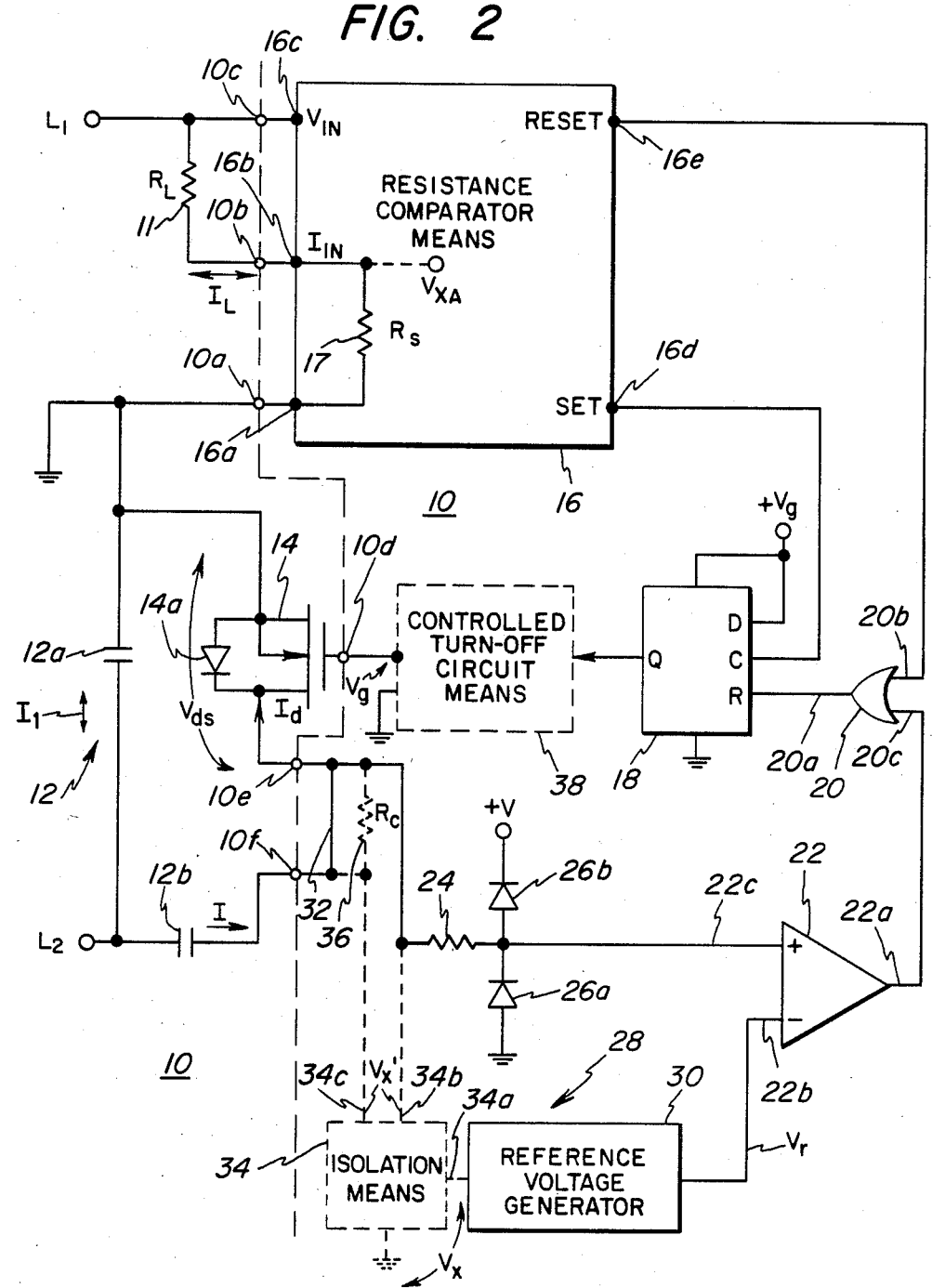
FIG. 2 is a schematic block diagram of a load control circuit including one presently preferred embodiment of the protection circuit of the present invention.

Referring now to FIG. 2, a presently preferred embodiment of a protective circuit 10 for removing control electrode drive to a power switching device in the event that the drive is insufficient to support the current flowing through the controlled-conduction channel of that device, or if excessive current flows through the channel, is illustrated. Protection circuit 10 is, by way of illustration only, utilized with a load 11, of magnitude $R_L$, in which a load current $I_L$ flows responsive to the action of a dual-capacitor power supply 12. Power supply 12, as more fully described and claimed, in co-pending application Ser. No. 379,393 filed on May 18, 1982, now U.S. Pat. No. 4,447,764, issued May 8, 1984, assigned to the assignee of the present invention and incorporated herein in its entirety by reference, operates at power line frequencies (e.g. at approximately 60 Hz.) and energizes a load 11 requiring a load voltage less than the line voltage between line terminals $L_1$ and $L_2$. Power supply 12 includes a main capacitor 12a effectively permanently connected in series with load 11, which establishes a minimum load current $I_1$, and an auxiliary capacitor 12b connected in series with the controlled-conduction channel of a switching device, e.g. an FET 14, across main capacitor 12a. A diode 14a, such as the parasitic diode already present in an FET, is connected across the FET drain-source. In addition to the minimum load current $I_1$ established by main capacitor 12a, an additional load current $I_d$ will flow through the auxiliary capacitor 12b during those portions of the source waveform cycle when the auxiliary capacitor is connected, by saturation of device 14, across the main capacitor, thus allowing the total load current $I_L$ to be adjusted over a range established by the magnitude of the main and auxiliary capacitors 12a and 12b. The portion of the source waveform cycle, during which device 14 conducts, is established by the presence of a voltage $V_g$ between the gate electrode of device 14 and the circuit common, e.g. at the device source electrode. This control electrode (gate) drive signal may be controlled, in part, by a resistance comparator means 16, as described and claimed in co-pending application Ser. No. 382,875, filed on May 28, 1982, now U.S. Pat. No. 4,421,993, issued Dec. 20, 1983, assigned to the assignee of the present invention and also incorporated herein in its entirety by reference. As described in that application, the resistance comparator means has a first input terminal 16a connected to a circuit common terminal 10a, an input current $I_{IN}$ terminal 16b connected to a load terminal 10b, and an input voltage $V_{IN}$ terminal 16c connected to a circuit line $L_1$ terminal 10c. The comparator 16 includes a sampling resistance 17, of magnitude $R_s$ connected in series with load resistance 11, for providing a voltage at terminal 16b, with respect to terminal 16a, related to the current flowing through the load. This load-current-related voltage is compared with a voltage at terminal 16c, with respect to terminal 16a, relating to the voltage across the temperature-dependent resistance $R_L$ of load 11. Responsive to the instantaneous voltages at terminal 16b and 16c, resistance comparator means 16 provides a first SET signal at a first output 16d and another RESET signal at a second output 16e. The SET and RESET signals are respectively utilized to enable and disable the control-electrode (gate) voltage $V_g$ at a terminal 10d, for switching device 14 into the saturated and cut-off regions, respectively. In the above-designated application, the SET and RESET signals respectively set and reset a flip-flop-like circuit to enable a positive gate voltage and reset that gate voltage to the substantially zero volt level at the switching device 14 gate electrode. In accordance with the protection circuit of the present invention, illustrated embodiment 10 includes a D-type flip-flop 18, having its clock C input connected to the SET output 16d of the resistance comparator means, and the data D input thereof connected to a potential $+V_g'$ source, which $+V_g'$ source also provides operating potential to the flip-flop element 18. The reset R input of device 18 is connected to the output 20a of a 2-input OR gate 20, having a first input 20b connected to the RESET output 16e of the resistance comparator means. The remaining gate input 20c is connected to the output 22a of a comparator means 22. The Q output of flip-flop device 18 is connected, in a first preferred embodiment, directly to circuit control output terminal 10d and thence to the gate electrode of the switching device 14. In this configuration, the flip-flop device high Q output voltage (of about $V_g'$ voltage) enables device 14 into saturation responsive to the presence of a high logic level at the SET output 16d of the resistance comparator means, and the low Q output level disables device 14 into the cut-off condition, responsive to either a high logic level at the RESET output 16e of the resistance comparator means, or a high logic level at the comparator output 22a.

Comparator output 22a is enabled to the high logic level only if the drain-source voltage $V_{ds}$ of the switching device 14 has an instantaneous magnitude exceeding a reference voltage $V_r$ level at the comparator inverting input 22b. To facilitate the foregoing action, the switching device drain source voltage is provided through a current-limiting resistor 24 to the non-inverting input 22c of the comparator. Input 22c is also connected to the junction of a pair of series-connected protection diodes 26a and 26b; the anode of diode 26a is connected to common (ground) potential, while the cathode thereof and the anode of diode 26b are connected to input 22c. The cathode of 26b is connected to a source of positive operating potential $+V$.

The reference voltage $V_r$ at comparator input 22b is provided by a reference voltage generator means 28, which includes at least a substantially-constant reference voltage generator means 30. If the substantially-constant comparison voltage curve 8 (see FIGS. 1a and 1b) is to be utilized, the substantially-constant reference voltage generator means 30 provides reference voltage $V_r$ as the substantially-constant voltage $V_{r1}$, with respect to circuit common. In this case, the drain electrode of device 14 is connected to a circuit terminal 10e and thence through a jumper connection 32 to another terminal 10f, at which the associated terminal of auxiliary capacitor 12b is connected. If the variable-voltage curve 9 of FIGS. 1a and 1b is to be utilized, substantially-constant reference voltage generator means 30 is set to the associated offset voltage $V_{r2}$ value (e.g. offset voltage k', k'' and the like) and this voltage is added to a variable voltage $V_x$ proportional to the device dynamic resistance.

This voltage $V_x$ may be provided at the output 34a of an isolation means 34 such that the sum of variable voltage $V_x$ and the substantially-constant offset voltage $V_{r2}$ will provide the total reference voltage $V_r$ to the comparator input 22b. The isolation means 34 output voltage $V_x$ is substantially equal in magnitude to the magnitude $V_x$, of a voltage between a pair of isolation means input terminals 34b and 34c. If isolation means 34 is utilized, input terminals 34b and 34c are respectively connected to circuit terminals 10e and 10f, and jumper 32 is replaced with a resistance 36 (shown in broken line) of magnitude $R_c$ (the dynamic channel resistance). Thus, drain current $I_d$ flowing into device 14 must flow through resistor 36 whereby this voltage $V_x'$ is not referenced to ground potential, means 34 isolates this "floating" voltage and provides the magnitude thereof as the output voltage $V_x$ at output 34a, now referenced to ground potential. Therefore, the reference voltage $V_r$ is now equal to the sum of $V_{r2}$ (provided by reference voltage generator means 30) and the voltage $V_x = I_d R_c$, to establish a comparison voltage as in curve 9.

If the normal control means, such as resistance comparator 16, requires the use of a current-sampling resistance 17, the variable voltage $V_x$ is already available from the voltage $V_{xa}$ across the sampling resistance. By proper scaling of this voltage $V_{xa}$, in part to account for the flow of current through main capacitor 12a which is not to be considered in determining the variable voltage $V_x$, the reference $V_r$ voltage can be made equal to the sum of $V_x$ and $V_{r2}$, to establish the curve 9 comparison voltage.

In operation, normal operation of switching device 14 is controlled by comparator means 16, as described in the aforementioned applications. Under cold-start, transient and similar conditions wherein the load current $I_L$ increases to a magnitude greater than that current magnitude capable of being supported by the control electrode (gate) voltage $V_g$ supplied to device 14, protection circuit 10 operates in the following manner: because the drive voltage $V_g$ is insufficient to support device 14 in saturation for the instantaneous current $I_d$ then flowing, the switching device conduction channel voltage $V_{ds}$ instantaneously increases. With only a relatively insignificant comparator input bias current flowing through series resistor 24, the comparator non-inverting input 22c voltage is substantially equal to the channel voltage $V_{ds}$, unless the channel voltage changes to such an extent that one of protection diodes 26 is forward biased. The voltage at input 22c is normally less than the reference $V_r$ voltage at comparator input 22b, whereby comparator output 22a is normally at a low logic level; the comparator output low logic level does not act to reset flip-flop 18. Responsive to an increased channel voltage drop $V_{ds}$ substantially equal to, or greater than, the reference $V_r$ voltage, the comparator output 22a switches to a high logic level. This high logic level at gate input 20c provides a high logic level at the reset R input of flip-flop 18, causing the Q output thereof to switch to a low logic level. Responsive to the low logic level at the Q output, device 14 is switched to the cut-off condition and excessive power dissipation therein is prevented.

It should be understood that the flip-flop element 18 may be of the CMOS and the like type, whereby the flip-flop will operate over a range of supply voltages $+V_g'$, and supply a Q output high logic level proportional to the supply voltage. In this manner, the control electrode $+V_g$ voltage can be set to support a desired maximum controlled-conduction current $I_d$ for a particular use. It should also be understood that the Q output of flip-flop 18 need not be connected directly to circuit output terminal 10d (and the control-gate electrode of device 14), but could be connected to other control electrode conditioning circuitry, such as a controlled turn-on circuit means 38, as more fully described and claimed in co-pending application Ser. No. 499,579, filed on May 31, 1983, assigned to the assignee of the present invention and incorporated herein by reference in its entirety. Circuit means 38 may provide for a time-controlled circuit turn-on action with fast circuit turn-off action (although a time-controlled circuit turn-off action with fast circuit turn-on, or a time-controlled circuit turn-on and turn-off action could also be provided) as may be desirable, e.g. to limit the load voltage and/or current time rate-of-change and thus control EMI and other potential problems associated with load control circuitry.

The protection operation of circuit 10 is further illustrated in FIGS. 2a and 2b, wherein the waveform of the current I through the auxiliary capacitance 12b (the sum of the controlled-conduction channel $I_d$ current and the parasitic diode current) and the drain-source $V_{DS}$ voltage waveform are respectively illustrated for a power-line-operated lamp control circuit. In the left-hand portion of the waveforms, the protection circuit 10 has been temporarily disconnected. At time $t_0$, terminal $L_1$ is positive with respect to terminal $L_2$, whereby a portion of the load current flows through the forward-biased parasitic diode 14a and auxiliary capacitor 12b. This current portion 41 charges auxiliary capacitor 12b to the peak line voltage (e.g. about 175 volts), whereby the switching device 14 drain-source voltage $V_{DS}$ is offset, in subsequent source waveform half-cycles wherein device 14 does not appreciably conduct, to have a substantially zero minimum value and a maximum value at about twice the line-to-line peak voltage, e.g. about 350 volts, as shown by voltage waveform portion 43. A "starved" power supply (not shown in FIG. 2, but shown in at least the aforementioned U.S. Pat. No. 4,421,973) slowly increases its output potential, which is applied to resistance comparator means 16 and flip-flop element 18. The power supply potential finally reaches, at time $t_1$, a value at which switching device 14 can be turned-on. During the time interval between time $t_0$ and time $t_1$, the lamp load resistance 11 has received that minimum load current $I_1$ set by the main power supply capacitor 12a, and the temperature of load resistance 11 has slowly increased. However, at time $t_1$, the load resistance is still less than the steady-state resistance which the lamp load will have when it attains full operating temperature. Thus, at time $t_1$, some gate electrode voltage $V_g$ is available at terminal 10d and current begins to flow through the controlled-conduction channel of device 14, if terminal $L_2$ is positive with respect to terminal $L_1$. The channel current $I_d$ portion 45 increases until the device pulls out of saturation and enters the active region at point 45a. Simultaneously therewith, the switching device channel voltage, in portion 47, is at the associated saturation voltage level, until point 47a is reached. As the lamp load has a lower-than-normal "cold" resistance, load 11 tries to draw more current than can be supported by the control-electrode (gate) voltage $V_g$ then being supplied. Accordingly, for an additional small current increase, shown in portion 45b, the switching device drain-source voltage rapidly increases, as in portion 47b, as the device pulls out of saturation due to lack of adequate gate drive signal. Thus, until time $t_2$ thereafter, device 14 is operating in the active region and is dissipating excessive power. If this excessive power dissipation occurs for a long enough time in the interval between the time $t_1$ and time $t_2$, device 14 may be destroyed. The adverse temperature effects on device 14 may be further increased by the current portion 49 subsequently flowing through the switching device parasitic diode 14a, which current portion 49 serves to re-charge auxiliary capacitor 12b, and therefore has an area thereunder equal to the area under the totality of current curve portions 45 and 45b.

With the protection circuit 10 connected, as in the right-hand portion of the waveforms of FIGS. 2a and 2b, the same start-up phenomena occur in the time interval between time $t_0$ and a time $t_1'$ at which the control-electrode (gate) voltage $V_g$ first reaches the conduction threshold of switching device 14. After some charging of auxiliary capacitor 12b through parasitic diode 14a as shown by each of portions 41', the source voltage polarity between terminals $L_1$ and $L_2$ changes. With terminal $L_2$ positive with respect to terminal $L_1$, auxiliary capacitor current I begins to flow through the controlled-conduction channel of switching device 14. Because the "starved" power supply voltage is still "ramping up" to its steady-state value, the control-electrode (gate) voltage is, at time $t_a$, less than the full control-electrode voltage desired, whereby saturation current $I_1$ (very much less than the steady-state saturation current $I_N$) can be supported. Therefore, the instantaneous drain-source voltage across the controlled-conduction channel device 14 increases, as shown in portion 49a, to a level greater than the reference $V_r$ voltage, causing the comparator output 22a voltage to increase and reset flip-flop element 18 to remove gate drive from the device. Responsive thereto, power switching device 14 is controlled to the cut-off condition and the flow of current I through the auxiliary capacitor 12b branch abruptly terminates. One source waveform cycle later, at time $t_b$, terminal $L_2$ is again positive with respect to terminal $L_1$; auxiliary capacitor current again begins to flow through the series-connected controlled-conduction channel of power switching device 14. Since the power supply voltage has increased somewhat, the gate voltage $V_g$ is somewhat greater than at time $t_a$, and will support a somewhat greater saturation current $I_2$. However, the saturation current $I_2$ now supported is still less than the current $I_N$ required by the load, whereby the device drain source voltage again increases beyond the saturation reference voltage $V_r$, as in portion 49b. The comparator output 22a level again rises and causes control-electrode voltage to be removed from the power switching device, abruptly terminating current flow therethrough and preventing excessive power dissipation. At subsequent times $t_c$–$t_g$, the increasing power supply voltage increases the gate voltage, to support increasing magnitudes of power switching device controlled-conduction channel current flow, as in portions 48c–48g. Each of these current flows reaches a peak current which is greater than the associated saturation current $I_3$–$I_7$ value supported by the then-present gate voltage, and which is still less than the normal load current $I_N$. The device pulls out of saturation and causes the device drain-source voltage waveform to have a portion 49c–49g thereof greater than the reference $V_r$ voltage, whereby the protection circuit operates and removes drive signal to device 14. At time $t_h$, the starved power supply finally provides full operating potential and the gate voltage $V_g$ finally reaches its normal value, capable of supporting the auxiliary capacitor normal current magnitude $I_N$ as a saturation current. The device source-drain voltage $V_{DS}$, as at portion 49h, does not reach a magnitude equal to the reference $V_r$ voltage magnitude, and protection circuit 10 does not operate. Instead, the resistance comparator means 16 operates in its intended and normal manner, and provides a high logic level RESET output 16e signal, at some time after time $t_h$, to terminate auxiliary capacitor signal flow and thus control load resistance temperature by controlling the current flow therein. Responsive thereto, the voltage across load 11 changes, as does the peak-to-peak voltage across the switching device. Only in the event of a diminution of control-electrode (gate) voltage $V_g$ or an increased load current demand greater than that supportable by the control-electrode voltage then provided to device 14, will protection circuit 10 now operate to prevent excessive power dissipation in the protected power switching device 14.

While one presently preferred embodiment of my novel power switching device protection circuit and method has been described in detail herein, many modifications and variations will now become apparent to those skilled in the art. It is my intent, therefore, to be limited only by the scope of the appending claims and not by the specific details and instrumentalities presented by way of explanation of a single presently preferred embodiment herein.

What I claim is:

1. Apparatus for preventing excessive power dissipation in a power switching semiconductor device having a controlled-conduction circuit connected to a load and a control electrode receiving a drive signal supporting a flow of saturation current through said controlled conduction circuit up to a maximum value determined by the magnitude of the drive signal, comprising:
   means for applying an AC voltage across said connected controlled-conduction circuit and load;
   means for providing a saturation reference voltage;
   comparison means for providing a protect signal if the magnitude of that portion of the AC voltage across the controlled-conduction circuit of the semiconductor device instantaneously exceeds the saturation reference voltage and including: a comparator having a first input receiving the voltage across the controlled-conduction circuit of said device, a second input receiving said saturation reference voltage, and an output providing said protect signal only if the magnitude of the voltage at said first input exceeds the magnitude of the voltage at said second input; and
   means for completely removing the control electrode drive signal from said device for the remainder of each AC voltage cycle during which said protect signal is provided by said comparison means, and including: a flip-flop element having a set input, a reset input receiving said comparison means protect signal, and an output at which said control electrode signal appears responsive to said set input being enabled by a signal external to said apparatus, but only if said comparison means protect signal is not present at said rest input.

2. The apparatus of claim 1, wherein said saturation reference voltage is a substantially constant voltage.

3. The apparatus of clim 2, wherein the substantially constant voltage is of a preselected magnitude greater than the voltage across the device controlled-current circuit for the maximum value of saturation current flow through said device.

4. The apparatus of claim 1, wherein said saturation reference voltage is proportional to the magnitude of current flowing through the controlled-conduction circuit of the device.

5. The apparatus of claim 4, wherein the saturation reference voltage is equal to the sum of an offset voltage and a voltage proportional to the magnitude of controlled-conduction circuit current flowing through the device.

6. The apparatus of claim 5, wherein said device has a dynamic channel resistance, and said apparatus further includes means for providing said proportional voltage as a product of the dynamic channel resistance and the current flowing therethrough.

7. The apparatus of claim 6, wherein said offset voltage is a substantially constant voltage.

8. The apparatus of claim 7, further comprising means for providing the substantially constant offset voltage with a predetermined magnitude.

9. The apparatus of claim 6, wherein said proportional-voltage-providing means comprises: a resistance in series with the controlled-current circuit of said device and having a magnitude substantially equal to the magnitude of the dynamic channel resistance of the device; and isolation means for providing said proportional voltage, of magnitude substantially equal to the magnitude of the voltage developed across said series resistor, in series with the offset voltage.

10. The apparatus of claim 1, further comprising means cooperating with said drive-signal-removing means for causing the magnitude of the drive signal to change in a time-controlled manner during at least one of the application and removal of the drive signal to the device control electrode.

11. The apparatus of claim 10, wherein said time-controlled causing means is adapted to control only the application of said drive signal to said control electrode, and does not substantially prevent said removing means from abruptly removing the drive signal from said control electrode.

12. The apparatus of claim 1, wherein said control electrode signal is a drive voltage.

13. The apparatus of claim 1, wherein said control electrode signal is a drive current.

* * * * *